US012625405B2

(12) United States Patent
Huangfu et al.

(10) Patent No.: US 12,625,405 B2
(45) Date of Patent: May 12, 2026

(54) DISPLAY SUBSTRATE AND DISPLAY DEVICE

(71) Applicant: BOE TECHNOLOGY GROUP CO., LTD., Beijing (CN)

(72) Inventors: Lujiang Huangfu, Beijing (CN); Weiwei Wang, Beijing (CN); Shanshan Bai, Beijing (CN); Jiangnan Lu, Beijing (CN); Wenxiu Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 551 days.

(21) Appl. No.: 18/022,367

(22) PCT Filed: Mar. 4, 2022

(86) PCT No.: PCT/CN2022/079290
§ 371 (c)(1),
(2) Date: Feb. 21, 2023

(87) PCT Pub. No.: WO2023/273387
PCT Pub. Date: Jan. 5, 2023

(65) Prior Publication Data
US 2023/0320160 A1 Oct. 5, 2023

(30) Foreign Application Priority Data
Jun. 29, 2021 (CN) .......................... 202110725455.X

(51) Int. Cl.
*H10K 59/35* (2023.01)
*G02F 1/1343* (2006.01)
(52) U.S. Cl.
CPC ..... *G02F 1/134345* (2021.01); *H10K 59/352* (2023.02); *H10K 59/353* (2023.02); *G02F 2201/52* (2013.01)

(58) Field of Classification Search
CPC ............................................. H10K 59/35–353
See application file for complete search history.

(56) References Cited

U.S. PATENT DOCUMENTS

| | | |
|---|---|---|
| 4,842,371 A | 6/1989 | Yasuda et al. |
| 5,144,288 A | 9/1992 | Hamada et al. |
| | (Continued) | |

FOREIGN PATENT DOCUMENTS

| | | |
|---|---|---|
| CN | 102201430 A | 9/2011 |
| CN | 104835832 A | 8/2015 |
| | (Continued) | |

OTHER PUBLICATIONS

International Search Report, International Searching Authority, International application No. PCT/CN2022/079290, Apr. 28, 2022, all pages. (Year: 2022).*

(Continued)

*Primary Examiner* — Victoria K. Hall
(74) *Attorney, Agent, or Firm* — WHDA, LLP

(57) ABSTRACT

The present disclosure provides a display substrate and a display device. The display substrate includes a plurality of sub-pixels in rows. The sub-pixels in each row includes first sub-pixels, second sub-pixels and third sub-pixels arranged alternately, and two adjacent rows of sub-pixels are arranged in a staggered manner. In every two adjacent rows of sub-pixels, each first sub-pixel in one row of sub-pixels and the second sub-pixel and the third sub-pixel adjacent to the first sub-pixel in another row of sub-pixels form a pixel. White brightness centers of the pixels in a same pixel row are located on a same straight line, and a brightness center of the first sub-pixel is not on a same straight line as the brightness centers of the second sub-pixel and the third sub-pixel located in a same sub-pixel row.

20 Claims, 3 Drawing Sheets

(56) References Cited

U.S. PATENT DOCUMENTS

| | | | | |
|---|---|---|---|---|
| 5,311,337 | A | 5/1994 | McCartney, Jr. | |
| 6,429,599 | B1 | 8/2002 | Yokoyama | |
| 6,768,482 | B2 | 7/2004 | Asano et al. | |
| 6,940,222 | B2 | 9/2005 | Sakurai | |
| 2011/0234550 | A1 | 9/2011 | Hong et al. | |
| 2016/0253972 | A1* | 9/2016 | Bai | G09G 3/3208 |
| | | | | 345/690 |
| 2017/0061907 | A1* | 3/2017 | He | G09G 3/3208 |
| 2018/0175121 | A1 | 6/2018 | Ji et al. | |
| 2021/0191556 | A1* | 6/2021 | Lee | H10K 59/8731 |
| 2022/0310707 | A1* | 9/2022 | Li | H10K 59/353 |
| 2022/0336541 | A1* | 10/2022 | Niu | H10K 59/352 |

FOREIGN PATENT DOCUMENTS

| | | | | |
|---|---|---|---|---|
| CN | 208062054 | U | 11/2018 | |
| CN | 110707141 | A * | 1/2020 | H10K 59/353 |
| CN | 110707141 | B | 9/2021 | |
| CN | 215578572 | U | 1/2022 | |

OTHER PUBLICATIONS

Written Opinion of the International Searching Authority, International Searching Authority, International application No. PCT/CN2022/079290, Apr. 28, 2022, all pages. (Year: 2022).*

Brian A. Wandell, Chapter 2: Image Formation, Foundations of Vision, Stanford University, 1995. (29 pages).

Z. Hara et al., Picture Quality of Different Pixel Arrangements for Large-Sized Matrix Displays, Electronics and Communications in Japan, Part 2, vol. 77, p. 106-120, 1994. (16 pages).

L. Huangfu et al., Analysis of Luminance uniformity and relevant issues with virtual pixel display and countermeasures, Technology Center, BOE Technology Group Co., LTD., Jun. 2019. (16 pages).

L. Jing et al., Application of center of gravity method in photoelectric signal processing, 1999. (5 pages).

L. Chen, Influence of pixel-structure noise on image resolution and color for matrix display devices, Journal of the SID, 1993, pp. 103-110. (8 pages).

* cited by examiner

DISPLAY SUBSTRATE AND DISPLAY DEVICE

CROSS-REFERENCE TO RELATED APPLICATION

This application is the U.S. national phase of PCT Application No. PCT/CN2022/079290 filed on Mar. 4, 2022, which claims a priority of the Chinese patent application No. 202110725455.X filed on Jun. 29, 2021, which is incorporated herein by reference in its entirety.

TECHNICAL FIELD

The present disclosure relates to the field of display technology, in particular to a display substrate and a display device.

BACKGROUND

Pixel is a smallest independent unit of a display device for exhibiting an image, and for a color display device, the pixel needs to include sub-pixels in three primary colors, i.e., red (R), green (G), and blue (B), so as to independently exhibit various colors in a color space. Usually, a pixel consisting of the red, green and blue subpixels is called as a real RGB pixel. Currently, a real RGB pixel format is adopted by the mainstream color display device, and it includes pixel constitution and corresponding image signals for the color display device.

In order to achieve high-quality display, Pixel Per Inch (PPI) of the color display device increases along with the technological progress, but the difficulty in the manufacture of a display element increases due to the high PPI. Especially for an Active Matrix Organic Light-Emitting Diode (AMOLED) display device for mobile display, due to the limitation of a mainstream technique for patterning a light-emitting region of the sub-pixel (i.e., a Fine Metal Mask (FMM) technique), it is difficult to manufacture the high-PPI display device. Apart from an enhanced process ability and the use of a low-redundancy dummy pixels, in real RGB pixel architecture, it is also able to manufacture the high-PPI display device through a more appropriate arrangement mode of the RGB sub-pixels.

The pixel in a Delta RGB arrangement mode is used to increase the PPI of the display device. In this mode, the sub-pixels in the three primary colors (brightness centers) form three vertices of an equilateral triangle, and the equilateral triangle is turned upside down and then translated transversely by one pixel pitch to form an adjacent pixel. The two pixels adjacent to each other in a transverse direction and having different configurations form a minimum repeat unit. The repeat unit is translated upward, downward, leftward and rightward to form an entire display region.

In the Delta RGB arrangement mode, the sub-pixels in the primary colors are distributed evenly, and a process for forming the light-emitting region of the sub-pixel is provided with excellent directional balance, so it is able to provide a high aperture ratio of the sub-pixel and a high physical distribution ratio in the case of an equal process accuracy (a same width of a Pixel Definition Layer (PDL)). In addition, in the Delta RGB arrangement mode, it is also able to improve the quality of patterns and colors. However, in the case of the insufficient PPI, in the delta RGB arrangement mode, a transverse line displayed by the display device is a wavy line to some extent, so it is unsuitable for such applications as Office where a large quantity of patterns with fine lines, e.g., Chinese characters including a large quantity of straight lines. Hence, the use of the Delta RGB arrangement mode is restricted.

SUMMARY

An object of the present disclosure is to provide a display substrate and a display device, so as to prevent the occurrence of a wavy transverse line in the Delta RGB arrangement mode.

In order to solve the above-mentioned technical problem, the present disclosure provides the following technical solutions.

In a first aspect, the present disclosure provides in some embodiments a display substrate, including a plurality of sub-pixels in rows. The sub-pixels in each row includes first sub-pixels, second sub-pixels and third sub-pixels arranged alternately, and two adjacent rows of sub-pixels are arranged in a staggered manner. In every two adjacent rows of sub-pixels, each first sub-pixel in one row of sub-pixels and the second sub-pixel and the third sub-pixel adjacent to the first sub-pixel in another row of sub-pixels form a pixel. White brightness centers of the pixels in a same pixel row are located on a same straight line, and a brightness center of the first sub-pixel is not on a same straight line as the brightness centers of the second sub-pixel and the third sub-pixel located in a same sub-pixel row.

In a possible embodiment of the present disclosure, the brightness centers of the first sub-pixels in a same sub-pixel row are on a same straight line.

In a possible embodiment of the present disclosure, the brightness center of the second sub-pixel and the brightness center of the third sub-pixel in a same sub-pixel row are on a same straight line.

In a possible embodiment of the present disclosure, the white brightness centers of the pixels in a same pixel column are located on a same straight line.

In a possible embodiment of the present disclosure, the sub-pixels of each pixel in a same pixel column are arranged in a same mode.

In a possible embodiment of the present disclosure, the sub-pixels in a same sub-pixel column are in a same color.

In a possible embodiment of the present disclosure, a line connecting the brightness center of the first sub-pixel, the brightness center of the second sub-pixel and the brightness center of the third sub-pixel forms an isosceles triangle or an equilateral triangle.

In a possible embodiment of the present disclosure, the first sub-pixel is a green sub-pixel, one of the second sub-pixel and the third sub-pixel is a red sub-pixel, and the other of the second sub-pixel and the third sub-pixel is a blue sub-pixel.

In a possible embodiment of the present disclosure, the display substrate is an OLED display substrate, an area of the red sub-pixel is S1, an area of the green sub-pixel is S2, an area of the blue sub-pixel is S3, and S1<S2<S3.

In a possible embodiment of the present disclosure, the display substrate is a Liquid Crystal Display (LCD) substrate, and an area of the red sub-pixel, an area of the green sub-pixel and an area of the blue sub-pixel are equal.

In a possible embodiment of the present disclosure, each of the first sub-pixel, the second sub-pixel and the third sub-pixel is of a rectangular, hexagonal or diamond shape.

In a possible embodiment of the present disclosure, adjacent sides of two adjacent sub-pixels in different colors are parallel to each other.

In a possible embodiment of the present disclosure, the adjacent sides of two adjacent sub-pixels in different colors parallel to each other are perpendicular to a line connecting the brightness centers of the two sub-pixels in different colors.

In a possible embodiment of the present disclosure, the second sub-pixel and the third sub-pixel are of a same shape, and the first sub-pixel is of a shape different from the second sub-pixel and the third sub-pixel.

In a possible embodiment of the present disclosure, each sub-pixel is equally spaced from the other surrounding sub-pixels.

In a second aspect, the present disclosure provides in some embodiments a display device including the above-mentioned display substrate.

According to the embodiments of the present disclosure, the white brightness centers of the pixels in a same row are located on a same straight line. As a result, it is able to prevent the occurrence of a wavy transverse line displayed by the pixels, thereby to improve a display effect.

BRIEF DESCRIPTION OF THE DRAWINGS

Through reading the detailed description hereinafter, the other advantages and benefits will be apparent to a person skilled in the art. The drawings are merely used to show the preferred embodiments, but shall not be construed as limiting the present disclosure. In addition, in the drawings, same reference symbols represent same members. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
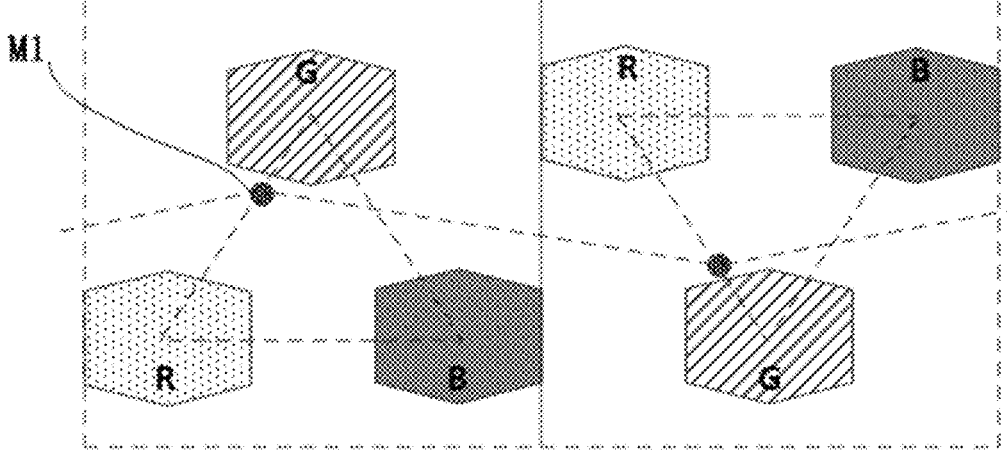
FIG. 1 is a schematic view showing a pixel with a Delta RGB arrangement mode in the related art.

FIG. 1 shows a cause for the generation of a wavy transverse line on a display device where each pixel is in a Delta RGB arrangement mode. In the case of an insufficient PPI, a pixel sensed by human eyes is not a "dot" but a "region" with uneven brightness. When the pixel exhibits a white-balance pixel point, usually brightness of a green sub-pixel G is about 65% of total brightness, and brightness of a red sub-pixel is about 30% of the total brightness. Due to a low brightness effect, a blue sub-pixel B has a relatively small influence on a shape the "region". A white brightness center of the "region" sensed by the human eyes is approximately located on a line connecting brightness centers of the sub-pixels R and G at a position spaced apart from the subpixel G by about ⅓ of a length of the line. When the adjacent pixels in a transverse direction are turned upside down, there is a difference in positions of the white brightness centers M1 of the adjacent pixels. Hence, in the case of the insufficient PPI, the wavy transverse line displayed by these pixels may occur.

At first, it should be appreciated that, such concepts as pixel row, sub-pixel row, pixel column and sub-pixel column are involved in the embodiments of the present disclosure. The pixel rows and the pixel columns are rows and columns on the basis of pixels, while the sub-pixel rows and the sub-pixel columns are rows and columns on the basis of sub-pixels. The pixels in one row may include sub-pixels in two rows, and the pixels in one column may include sub-pixels in three columns.

In addition, it should also be appreciated that, for a brightness center of the sub-pixel involved in the embodiments of the present disclosure, a spatial intensity distribution of the spot generated by the sub-pixel is obtained through scanning the sub-pixel with an optical sensor, and then the spatial intensity distribution of the spot is analyzed and processed to obtain a position-stable point of the spot as the brightness center. Identically, for a white brightness center of the pixel, white light is generated through mixing light generated by three sub-pixels, a spatial intensity distribution of a spot generated by the pixel is obtained through scanning the pixel with the optical sensor, and then the spatial intensity distribution is analyzed and processed to obtain a position-stable point of the spot as the white brightness center.

Figure 2:
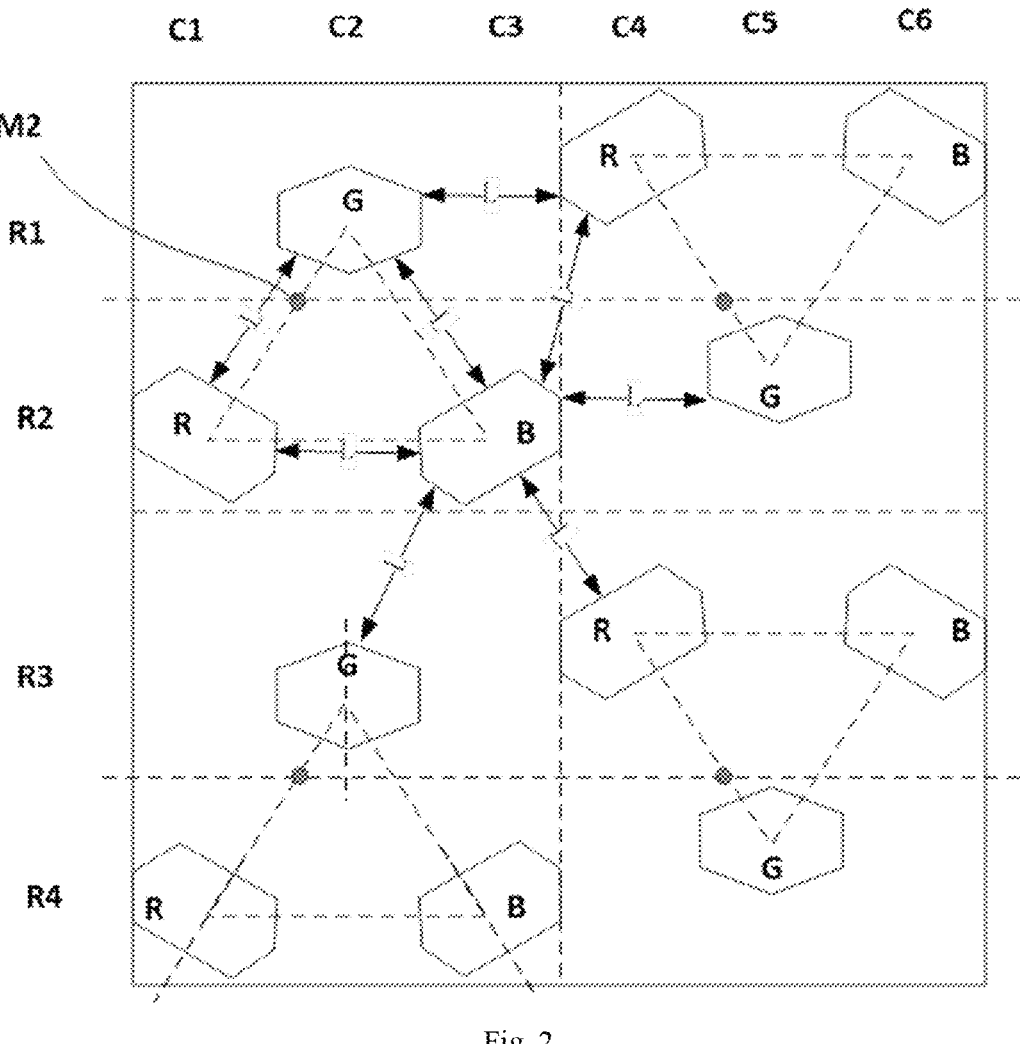
FIG. 2 is a schematic view showing a display substrate according to one embodiment of the present disclosure.

In order to solve the above-mentioned problems, referring to FIG. 2, the present disclosure provides in some embodiments a display substrate, which includes a plurality of sub-pixels in rows (R1, R2, R3, and R4 in FIG. 2 represent row numbers of the sub-pixels). The sub-pixels in each row include first sub-pixels G, second sub-pixels R, and third sub-pixels B arranged alternately. In the embodiments of the present disclosure, the sub-pixels in a same sub-pixel row are circularly arranged in G, R, B or R, B, G. In some other embodiments of the present disclosure, the sub-pixels in a same sub-pixel row may also be circularly arranged in G, B, R, or B, R, G. In the embodiments of the present disclosure, two adjacent rows of sub-pixels are arranged in a staggered manner, e.g., staggered by one sub-pixel or a half sub-pixel. In every two adjacent rows of sub-pixels, each first sub-pixel G in one row and the second sub-pixel R and the third sub-pixel B adjacent to the first sub-pixel G in another row form one pixel. White brightness centers M2 of the pixels in a same pixel row are located on a same straight line, and in a same sub-pixel row, a brightness center of the first sub-pixel G is not on a same straight line as brightness centers of the second sub-pixel R and the third sub-pixel B.

According to the embodiments of the present disclosure, the white brightness centers M2 of the pixels in a same pixel row are located on the same straight line, so it is able to prevent the occurrence of a wavy transverse line, thereby to improve a display effect.

Figure 3:
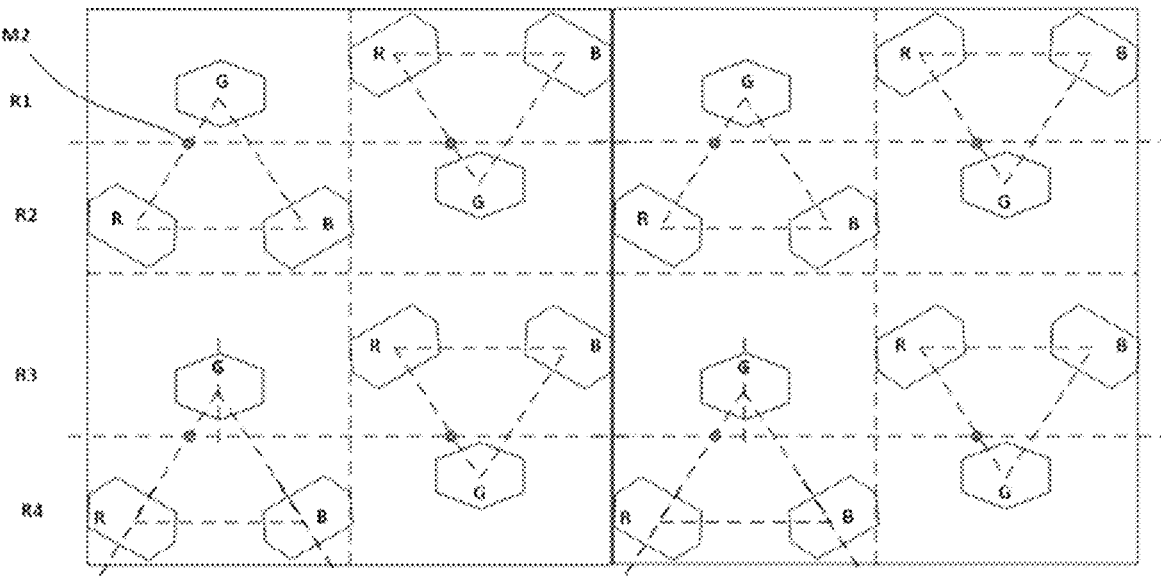
FIG. 3 is another schematic view showing the display substrate according to one embodiment of the present disclosure.

In a possible embodiment of the present disclosure, referring to FIG. 3, the brightness centers of the first sub-pixels G located in a same sub-pixel row are on a same straight line, so as to achieve the even distribution of the sub-pixels.

In a possible embodiment of the present disclosure, referring to FIG. 3, the brightness centers of the second sub-pixels R and the brightness centers of the third sub-pixels G in a same sub-pixel row are on a same straight line, so as to achieve the even distribution of the sub-pixels.

In a possible embodiment of the present disclosure, referring to FIG. 2 and FIG. 3, the white brightness centers of the pixels in a same pixel column are located on a same straight line, so as to prevent the occurrence of a wavy vertical line, thereby to improve the display effect.

In a possible embodiment of the present disclosure, referring to FIG. 2, the sub-pixels in a same sub-pixel column are in a same color (C1, C2, C3 . . . in FIG. 2 are column numbers of the sub-pixels), so as to achieve the even distribution of the sub-pixels.

In a possible embodiment of the present disclosure, referring to FIG. 2, the brightness centers of the sub-pixels in a same sub-pixel column are located on a same straight line, so as to achieve the even distribution of the sub-pixels.

In a possible embodiment of the present disclosure, referring to FIG. 2, the sub-pixels of each pixel in a same pixel column are arranged in the same mode. For example, for the pixels in a first column, the first sub-pixels G are located in a first row, and the second sub-pixels R and the third sub-pixels B are located in a second row. For the pixels in a second column, the first sub-pixels G are located in a second row, and the second sub-pixels R and the third sub-pixels B are located in a first row. Through this structure, it is able to achieve the even distribution of the sub-pixels.

In the embodiments of the present disclosure, as shown in FIG. 2, in a same pixel row, the sub-pixels of two adjacent pixels are arranged in different modes, and an arrangement mode of the sub-pixels in one pixel is turned upside down to obtain an arrangement mode of the sub-pixels in the adjacent pixel. As compared with a conventional structure, in the embodiments of the present disclosure, one pixel of the two adjacent pixels is moved upward as a whole, so that the white brightness center of the pixel is moved upward accordingly. In this way, it is able to ensure that the white brightness centers M2 of the pixels in a same pixel row are located on a same straight line, without any change in a shape of each sub-pixel and/or a position of each sub-pixel in the pixel.

In the embodiments of the present disclosure, referring to FIG. 2, a line connecting the brightness center of the first sub-pixel G, the brightness center of the second sub-pixel R and the brightness center of the third sub-pixel G forms an equilateral triangle.

In order to be adapted to an aspect ratio of a square-like pixel set in a current mainstream digital display data format, the triangle formed by the line connecting the brightness center of the first sub-pixel G, the brightness center of the second sub-pixel R and the brightness center of the third sub-pixel G may also be an isosceles triangle.

Based on the above, the first sub-pixel is a green sub-pixel, the second sub-pixel is a red sub-pixel, and the third sub-pixel is a blue sub-pixel. In some other embodiments of the present disclosure, the second sub-pixel may be a blue sub-pixel and the third sub-pixel may be a red sub-pixel. Furthermore, in some embodiments of the present disclosure, the first sub-pixel may also be a red sub-pixel or a blue sub-pixel.

In the embodiments of the present disclosure, the display substrate is an OLED display substrate, an area of the red sub-pixel is S1, an area of the green sub-pixel is S2, an area of the blue sub-pixel is S3, and S1<S2<S3. Through this structure, it is able to improve the display effect. For example, the ratio of S1, S2, and S3 is, but not limited to, 1:1.3:1.7.

In the embodiments of the present disclosure, the display substrate is an LCD display substrate, and the area of the red sub-pixel, the area of the green sub-pixel, and the area of the blue sub-pixel are equal. Through this structure, it is able to improve the display effect.

In a possible embodiment of the present disclosure, each of the first sub-pixel, the second sub-pixel and the third sub-pixel is of a rectangular, hexagonal or diamond shape. As shown in FIG. 2 and FIG. 3, each of the first sub-pixel, the second sub-pixel and the third sub-pixel is of a hexagonal shape, so as to increase an aperture ratio of the pixel.

In a possible embodiment of the present disclosure, referring to FIG. 2 and FIG. 3, a shape of the second sub-pixel R is the same as a shape of the third sub-pixel B, and the shape of the first sub-pixel G is different from the shape of the second sub-pixel R and the third sub-pixel B. As shown in FIG. 2 and FIG. 3, although the first sub-pixel G, the second sub-pixel R, and the third sub-pixel B are all of a hexagonal shape, the shape of the first sub-pixel G is different from the shapes of the second sub-pixel R and the third sub-pixel B. Of course, in some other embodiments of the present disclosure, the shape of the first sub-pixel G may also be the same as the shapes of the second sub-pixel R and the third sub-pixel B.

In a possible embodiment of the present disclosure, referring to FIG. 2, adjacent sides of two adjacent sub-pixels in different colors are parallel to each other. In other words, the side of the first sub-pixel G close to the second sub-pixel R is parallel to the side of the second sub-pixel R close to the first sub-pixel G, the side of the first sub-pixel G close to the third sub-pixel B is parallel to the side of the third sub-pixel B close to the first sub-pixel G, and the side of said second sub-pixel R close to the third sub-pixel B is parallel to the side of the third sub-pixel B close to the second sub-pixel R.

In a possible embodiment of the present disclosure, the adjacent sides of two adjacent sub-pixels in different colors parallel to each other are perpendicular to a line connecting the brightness centers of the two sub-pixels in different colors. In this way, it is able to increase an active area of each sub-pixel, thereby to improve the aperture ratio of the sub-pixel.

In a possible embodiment of the present disclosure, referring to FIG. 2, each sub-pixel is equally spaced from the other surrounding sub-pixels, where L represents a distance between the sub-pixels. In this way, it is able to achieve the even distribution of the sub-pixels.

The present disclosure further provides in some embodiments a display device including the above-mentioned display substrate.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a plurality of sub-pixels in rows wherein the sub-pixels in each row comprise first sub-pixels, second sub-pixels and third sub-pixels arranged alternately, and two adjacent rows of sub-pixels are arranged in a staggered manner;

in every two adjacent rows of sub-pixels, each first sub-pixel in one row of sub-pixels and the second sub-pixel and the third sub-pixel adjacent to the first sub-pixel in another row of sub-pixels form a pixel; and white brightness centers of the pixels in a same pixel row are located on a same straight line, and a brightness center of the first sub-pixel is not on a same straight line as the brightness centers of the second sub-pixel and the third sub-pixel located in a same sub-pixel row;

the first sub-pixel, the second sub-pixel, and the third sub-pixel in the pixel extend in different directions, wherein an extending direction of a sub-pixel in the plurality of sub-pixels is a maximum extension direction of the sub-pixel.

2. The display substrate according to claim 1, wherein the brightness centers of the first sub-pixels in a same sub-pixel row are on a same straight line.

3. The display substrate according to claim 1, wherein the brightness center of the second sub-pixel and the brightness center of the third sub-pixel in a same sub-pixel row are on a same straight line.

4. The display substrate according to claim 1, wherein the white brightness centers of the pixels in a same pixel column are located on a same straight line.

5. The display substrate according to claim 4, wherein the sub-pixels of each pixel in a same pixel column are arranged in a same mode.

6. The display substrate according to claim 1, wherein the sub-pixels in a same sub-pixel column are in a same color.

7. The display substrate according to claim 1, wherein a line connecting the brightness center of the first sub-pixel, the brightness center of the second sub-pixel and the brightness center of the third sub-pixel forms an isosceles triangle or an equilateral triangle.

8. The display substrate according to claim 1, wherein the first sub-pixel is a green sub-pixel, one of the second sub-pixel and the third sub-pixel is a red sub-pixel, and the other of the second sub-pixel and the third sub-pixel is a blue sub-pixel.

9. The display substrate according to claim 8, wherein display substrate is an Organic Light-Emitting Diode (OLED) display substrate, an area of the red sub-pixel is S1, an area of the green sub-pixel is S2, an area of the blue sub-pixel is S3, and S1<S2<S3.

10. The display substrate according to claim 1, wherein the display substrate is a Liquid Crystal Display (LCD)

substrate, and an area of the red sub-pixel, an area of the green sub-pixel and an area of the blue sub-pixel are equal.

11. The display substrate according to claim 1, wherein each of the first sub-pixel, the second sub-pixel and the third sub-pixel is of a rectangular, hexagonal or diamond shape.

12. The display substrate according to claim 11, wherein adjacent sides of two adjacent sub-pixels in different colors are parallel to each other.

13. The display substrate according to claim 12, wherein the adjacent sides of two adjacent sub-pixels in different colors parallel to each other are perpendicular to a line connecting the brightness centers of the two sub-pixels in different colors.

14. The display substrate according to claim 1, wherein the second sub-pixel and the third sub-pixel are of a same shape, and the first sub-pixel is of a shape different from the second sub-pixel and the third sub-pixel.

15. The display substrate according to claim 1, wherein each sub-pixel is equally spaced from the other surrounding sub-pixels.

16. A display device, comprising the display substrate according to claim 1.

17. The display device according to claim 16, wherein the brightness centers of the first sub-pixels in a same sub-pixel row are on a same straight line.

18. The display device according to claim 16, wherein the brightness center of the second sub-pixel and the brightness center of the third sub-pixel in a same sub-pixel row are on a same straight line.

19. The display device according to claim 16, wherein the white brightness centers of the pixels in a same pixel column are located on a same straight line.

20. The display device according to claim 19, wherein the sub-pixels of each pixel in a same pixel column are arranged in a same mode.

* * * * *